(12) United States Patent
Flynn

(10) Patent No.: US 7,164,297 B2
(45) Date of Patent: Jan. 16, 2007

(54) MULTIPLE REFERENCE CLOCK SYNTHESIZER

(75) Inventor: Cinda L. Flynn, Pflugerville, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 5 days.

(21) Appl. No.: 11/095,066

(22) Filed: Mar. 31, 2005

(65) Prior Publication Data

US 2006/0220697 A1    Oct. 5, 2006

(51) Int. Cl.
*H03B 21/00*    (2006.01)
*H03K 21/00*    (2006.01)

(52) U.S. Cl. ............... 327/107; 327/105; 377/48

(58) Field of Classification Search ........... 327/149, 327/153, 158, 161, 105, 107; 377/47, 48
See application file for complete search history.

(56) References Cited

U.S. PATENT DOCUMENTS 5,195,044 A * 3/1993 Wischermann ........... 702/124
5,977,805 A * 11/1999 Vergnes et al. ........... 327/107
6,459,753 B1 * 10/2002 Verlinden ................. 377/48
6,794,913 B1    9/2004 Stengel
6,998,928 B1 * 2/2006 Stengel et al. ............ 332/109

OTHER PUBLICATIONS

Dorin Emil Calbaza and Yvon Savaria, *Direct Digital Frequency Synthesis of Low-Jitter Clocks*, IEEE Journal of Solid-State Circuits, vol. 36, No. 3 Mar. 2001 pp. 570-572.

* cited by examiner

*Primary Examiner*—Dinh T. Le
(74) *Attorney, Agent, or Firm*—Gary R. Stanford

(57) ABSTRACT

A clock synthesizer for dividing a source clock by N.R including a logic circuit, a delay line, a select circuit, an accumulator, and a clock divider circuit. The logic circuit divides N.R by $2^M$ to get NNEW.RNEW in which NNEW is zero and RNEW is at least 0.5. The delay line receives a first clock and has multiple delay taps, where the first clock is based on the source clock. The select circuit selects the delay taps based on a tap select value and provides a delayed clock. The accumulator adds RNEW for each cycle of the delayed clock and performs a modulo function on a sum value to generate the tap select value. The clock divider circuit transitions an output clock based on selected transitions of the delayed clock, which is achieved by dividing the first clock or the delayed clock by $2^{M-1}$.

20 Claims, 8 Drawing Sheets

MULTIPLE REFERENCE CLOCK SYNTHESIZER

BACKGROUND OF THE INVENTION

1. Field of the Invention

The present invention relates in general to electronic devices, and more specifically to a multiple reference clock synthesizer that provides one or more fractional independent clock signals that generated from a single source clock.

2. Description of the Related Art

Many electronic devices use multiple clock signals at a variety of frequencies. A wireless hand-held electronic device, such as a cell phone or the like, uses a different frequency for each of multiple functions, such as a baseband core, digital signal processor (DSP), audio circuitry, video circuitry, USB circuitry, serial communications, etc. It is possible to include a separate phase locked loop (PLL) circuit for each independent clock signal. The multiple PLL solution, however, is not practical for many applications, such as battery-powered, hand-held electronic devices and the like, since each PLL clock circuit uses a substantial amount of space and consumes a considerable amount of power. Also, PLL circuits are mostly implemented with analog circuits which take a significant amount of time to change from one frequency to another. Frequency changes are performed on a regular basis in many hand-held electronic devices to conserve power and maximize battery life, and the delays associated with PLLs are disadvantageous.

It is desired to divide a single source clock by corresponding ratios to generate each of the clocks. Wireless baseband applications, for example, need multiple clocks generated independently for various fractional divide ratios including divide ratios close to 1.

BRIEF DESCRIPTION OF THE DRAWINGS

The benefits, features, and advantages of the present invention will become better understood with regard to the following description, and accompanying drawing in which.

DETAILED DESCRIPTION

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

The terms "a" or "an", as used herein, are defined as one or more than one. The term "plurality", as used herein, is defined as two or more than two. The term "another", as used herein, is defined as at least a second or more. The terms "including" and/or "having", as used herein, are defined as comprising (i.e., open language). The term "coupled", as used herein, is defined as connected, although not necessarily directly, and not necessarily mechanically. The term "program", as used herein, is defined as a sequence of instructions designed for execution on a computer system. A "program", or "computer program", may include a subroutine, a function, a procedure, an object method, an object implementation, in an executable application, an applet, a servlet, a source code, an object code, a shared library/dynamic load library and/or other sequence of instructions designed for execution on a computer system.

Figure 1:
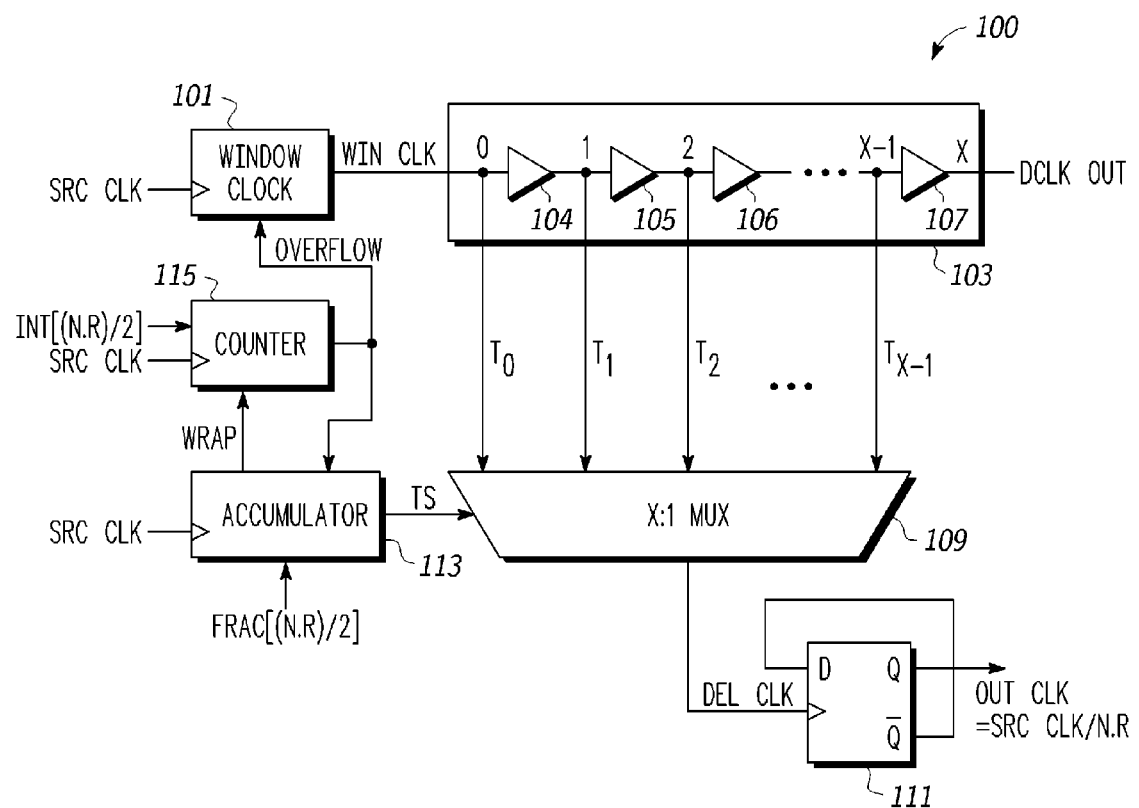
FIG. 1 is a block diagram of a clock synthesizer that may be used to generate a fractional independent clock from a source clock signal.

FIG. 1 is a block diagram of a clock synthesizer 100 that may be used to generate a fractional independent clock from a source clock signal SRC CLK. A window clock circuit 101 provides a clock pulse on a window clock signal WIN CLK at its output coincident with a rising edge of the SRC CLK signal while a signal OVERFLOW is asserted. The WIN CLK signal is provided to the input of a delay line 103 of a delay locked loop (DLL) circuit, where the delay line 103 outputs a delay line clock signal DCLK OUT at its output. The DLL circuit includes the delay line 103 and delay line loop control circuitry (not shown), such as, for example, a phase detector and filter circuits as known to those skilled in the art. The delay line 103 is made up of a plurality of cascaded controlled delay elements 104, 105, 106, . . . , 107, each having an input and an output. In the delay line 103, X such delay elements are provided each having a delay D. Such a delay line can be implemented using, for example, a series of buffers or inverter buffers, each with a voltage controlled delay for adjustment of the value of D. Thus, delay line 103 has an overall delay of X*D, where an asterisk "*" denotes multiplication. The overall delay of the delay line 103 is tuned by voltages (or other suitable control signals) applied to one or more control inputs (not shown). The overall delay of the delay line 103 is adjusted to delay the DCLK OUT signal by a predetermined delay, such as, for example, one clock cycle of the SRC CLK signal. In order to produce accurately synthesized signals, the delay of the delay elements 104–107 should be as equal as possible. The particular details of the configuration of the DLL circuit may be implemented according to known methods and are beyond the scope of the present disclosure. The DLL circuit may be implemented, for example, in accordance with U.S. Pat. No. 6,794,913 entitled "Delay Locked Loop With Digital To Phase Converter Compensation" by Stengel, which is incorporated herein by reference. The Stengel DLL is exemplary only and the present invention is not limited to any particular configuration of the DLL.

The input and the intermediate nodes of the delay elements 104–107 form a series of taps 0 to X−1, which are tapped to provide respective tap signals $T_0, T_1, T_2, \ldots, T_{X-1}$. The first tap signal $T_0$ is equivalent to the input clock signal WIN CLK provided to the input of the first delay element 104, having an output providing the $2^{nd}$ or tap 1 signal $T_1$ to the input of the delay element 105, and so on up to the last delay element 107 having the last tap signal $T_{X-1}$ as input and providing the DCLK OUT signal at its output. As understood by those skilled in the art, the DCLK OUT signal is in a locked arrangement with the input signal of the delay line 103 (e.g., WIN CLK or SRC CLK), and thus is considered to be the same signal and thus is not provided at a tapped output. The tap signals $T_0$–$T_{X-1}$ are provided to respective inputs of an X:1 multiplexer (MUX) 109, which has a select input receiving a tap select signal or value TS and an output providing a delay clock signal DEL CLK having a waveform with transitions determined by the delay line 103 and the selected taps over time. The DEL CLK signal is provided to the clock input of a D-type flip flop (DFF) 111, having its inverted Q output coupled to its D input and its Q output providing an output clock signal OUT CLK. In this manner, the DFF 111 effectively performs a divide-by-two function and transitions the OUT CLK signal with each rising edge of DEL CLK. The rising edges of DEL CLK are equally spaced to achieve a 50% duty cycle on the OUT CLK, which is desired when the OUT CLK is used to control dual-edge based circuitry.

An accumulator 113 has an output providing the TS value, a clock input receiving the SRC CLK signal and a load input receiving a value FRAC[(N.R)/2]. As described further below, the clock synthesizer 100 operates to divide the SRC CLK by a value N.R, where "N" is the integer portion and "R" is the fractional portion of the divide value. This value is divided by two and "FRAC" is a fractional function which provides the fractional value of the result. For example, if N.R=5.3125, then N=5 and R=0.3125, (N.R)/2=2.65625 and thus FRAC[(N.R)/2]=0.65625. In operation, the accumulator 113 adds the FRAC[(N.R)/2] value to its internal sum value with each rising edge of the SRC CLK signal while the OVERFLOW signal is also asserted. The internal sum of the accumulator 113 includes a certain number of bits to achieve a desired level of accuracy. In one embodiment, for example, the internal sum of the accumulator 113 includes 24 bits. The accumulator 113 performs a modulo-32 function of the 5 most significant bits (MSBs) of its internal sum value to provide a tap-sequence used to generate the TS value provided to the select input of the MUX 109. Using the above example, a FRAC[(N.R)/2] value of 0.65625 corresponds to a binary value of 1010_1000_0000_0000_0000_0000. Assuming an initial value of 0, in a first iteration the binary value of 1010_1000_0000_0000_0000_0000 is loaded as the internal sum, which results in a tap sequence value of 21 after the modulo-32 function. In the next iteration (when OVERFLOW is asserted and a rising edge occurs on SRC CLK), the accumulator 113 again adds the FRAC[(N.R)/2] value and performs the modulo-32 function resulting in a new tap sequence value of 10. The tap sequence proceeds in this manner providing a tap sequence of 0, 21, 10, 31, 20, 9, 30, etc., assuming the FRAC[(N.R)/2] value of 0.65625. The accumulator 113 also anticipates whether a wrap (sum exceeding 32) will occur in the following iteration assuming the same FRAC[(N.R)/2] value and asserts a pulse on the WRAP signal. Thus, in the next cycle of SRC CLK after the accumulator 113 is updated, the WRAP signal is pulsed high if the internal sum, when added to the current FRAC[(N.R)/2] value, will cause an overflow of the accumulator 113 in the next iteration.

The WRAP signal is provided to an input of a counter 115, which receives the SRC CLK signal at its clock input and a value INT[(N.R)/2] at another input, and which provides the OVERFLOW signal at its output. As described above, the clock synthesizer 100 operates to divide the SRC CLK by the value N.R, which is divided by two and "INT" is an integer function which provides the integer value of the result. For example, if N.R=5.3125, then N=5 and R=0.3125, (N.R)/2=2.65625 and thus INT[(N.R)/2]=2. The INT[(N.R)/2] value determines the total number of SRC CLK cycles the counter 115 counts before overflowing back to zero. Continuing the same example above, if the INT[(N.R)/2] value is 2, then the counter 115 counts from 0 to 1 and then back to 0 again to count two cycles. When the counter 115 is at the maximum value based on the given INT[(N.R)/2] value (such as a maximum value of 1 for an INT[(N.R)/2] value of 2), then it asserts the OVERFLOW signal on the next rising edge of the SRC CLK signal and returns to zero. When the WRAP signal is asserted, however, the counter increments its maximum count value by one during the current iteration and thus counts one extra cycle of the SRC CLK signal. Thus, for example, when the WRAP signal is asserted while the INT[(N.R)/2] value is 2 and the maximum count is thus 1, then the counter 115 instead counts up to 2 before asserting the OVERFLOW signal and returning back to zero.

Figure 2:
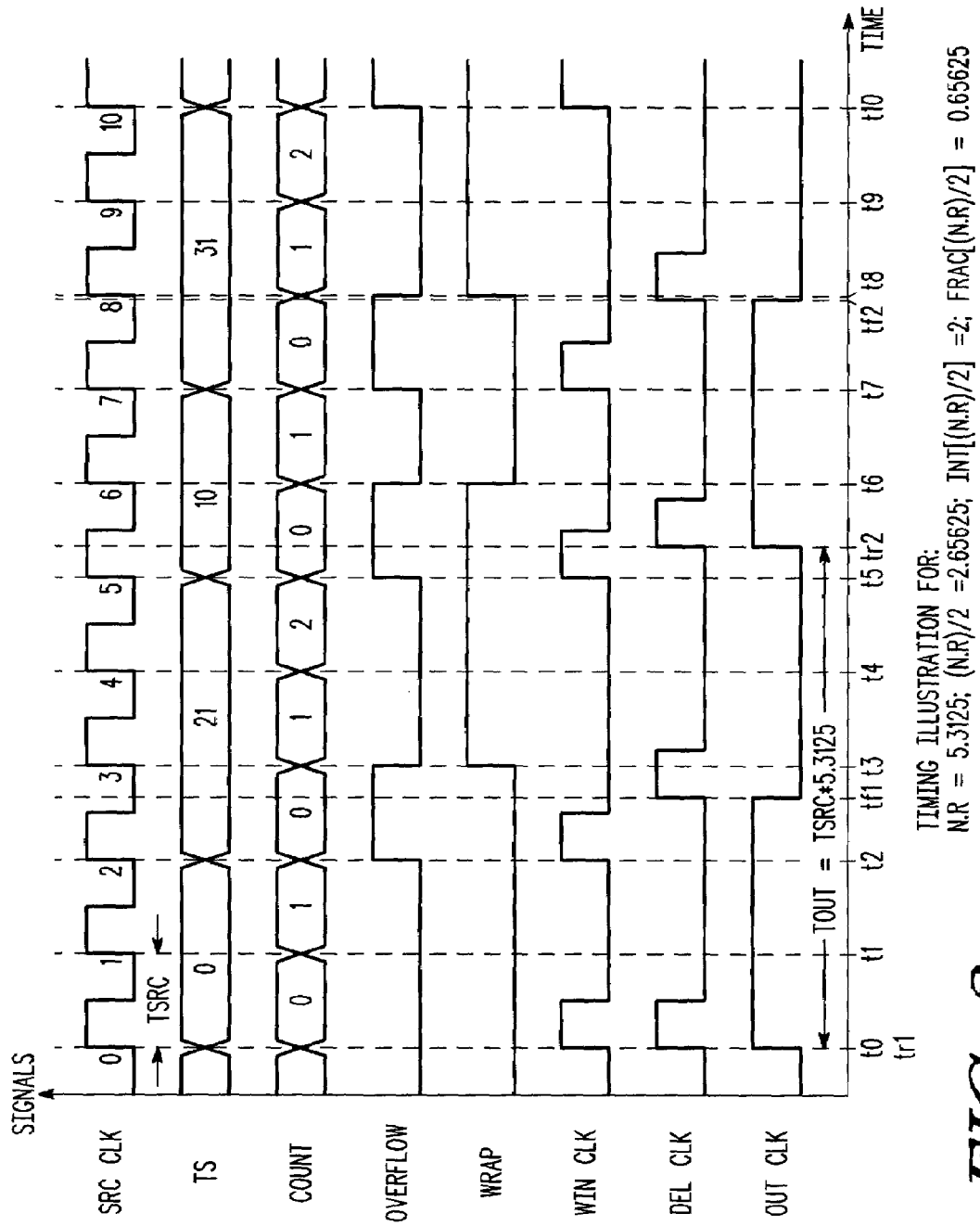
FIG. 2 is a timing diagram illustrating operation of the clock synthesizer of FIG. 1 for the specific case when the fractional divide ratio N.R=5.3125.

FIG. 2 is a timing diagram illustrating operation of the clock synthesizer 100 for the specific case when N.R=5.3125. The SRC CLK, TS, COUNT (of the counter 115), OVERFLOW, WRAP, the WIN CLK, the DEL CLK and the OUT CLK signals or values are all shown plotted versus TIME. The timing diagram of FIG. 2 is simplified in that certain logic delays are ignored. Ten consecutive cycles of the SRC CLK signal are shown in which each cycle is initiated by a corresponding one of consecutive rising edges, which are numbered from 0 to 9. The cycles of the SRC CLK signal are shown starting at times t0–t9, respectively, where the first cycle 0 occurs between times t0 and t1, the second cycle 1 occurs between times t1 and t2, and so on. The TS value is shown with a value of 0 during cycle 0 so that the tap signal $T_0$ is initially selected. The COUNT value is initially 0 and the OVERFLOW and WRAP signals are both initially zero during cycle 0 of SRC CLK. The WIN CLK signal pulses high beginning at time t0 during the first half of cycle 0 as a function of the window clock logic 101. Since the first tap 0 is initially selected, the DEL CLK also pulses high at time to coincident with the pulse on the WIN CLK signal. In the configuration illustrated, the OVERFLOW signal pulses high for one cycle of the SRC CLK when asserted and the WIN CLK and DEL CLK signals pulse high for one-half cycle of the SRC CLK signal when asserted. Since the WIN CLK signal goes high at time t0 and tap $T_0$ is selected, the clock pulse on the WIN CLK signal is selected causing a corresponding pulse on DEL CLK at about time t0, which clocks the DFF 111. The Q output of the DFF 111 is initially zero and its inverted Q output is high, so that a high value is clocked out of the DFF 111 and the OUT CLK signal goes high at about time t0. Time t0 is coincident with a "first" rising edge time of OUT CLK.

The counter 115 increments bringing the COUNT value to 1 in response to the rising edge of the SRC CLK signal at time t1. At the next rising edge of the SRC CLK signal at time t2, the counter 115 overflows so that the COUNT value returns to zero. The OVERFLOW signal is pulsed high at time t2 causing the accumulator 113 to add the FRAC[(N.R)/2] value (e.g., 0.65625) to its internal sum updating the TS value to 21. The window clock circuit 101 generates another pulse on the WIN CLK signal beginning at about time t2 in response to the OVERFLOW signal. It is noted that the TS value is updated before the WIN CLK signal is pulsed in the illustrated embodiment. In an alternative embodiment, described below, the WIN CLK signal is shifted so that the TS value is set up before WIN CLK is pulsed. Thus, the WIN CLK pulse propagates through the delay line 103 to the selected tap signal $T_{21}$ so that the pulse on DEL CLK is delayed by the delay line 103 for approximately 21/32*TSRC from time t2. The DEL CLK is pulsed during the third cycle of SRC CLK at about a time tf1 after the delay and clocks the DFF 111 so that the OUT CLK signal is pulled low at about time tf1. At the next rising edge of the SRC CLK signal at time t3, the COUNT value is incremented to 1, and the accumulator 113 determines that the next accumulation of the FRAC[(N.R)/2] value will cause an overflow, so that it asserts the WRAP signal high at time t3. At the next rising edge of SRC CLK at time t4, the COUNT value is incremented to 2 rather than 0 so that an overflow of the counter 115 does not yet occur. At the next rising edge of SRC CLK at time t5, the COUNT value goes back to 0 and the OVERFLOW signal is pulsed, so that the accumulator 113 updates the TS value to 10 and a pulse is asserted on WIN CLK. In this manner, the tap signal $T_{10}$ is selected so that the next pulse on the DEL CLK signal as a result of the WIN CLK pulse at time t5 is delayed by the delay line 103 for about 10/32*TSRC from time t5 or just less than $\frac{1}{3}^{rd}$ of the SRC CLK cycle. When the DEL CLK is pulsed during the sixth cycle of SRC CLK at about a time tr2, the DFF 111 is clocked so that the OUT CLK signal goes high at about time tr2 between times t5 and t6. At the next rising edge of SRC CLK at time t6, the COUNT value is incremented to 1 and the WRAP signal goes back to zero. At the next rising edge of SRC CLK at time t7, the COUNT value goes to 0 and the OVERFLOW signal is pulsed, so that the accumulator 113 updates the TS value to 31 to select tap signal $T_{31}$ and a pulse is asserted on WIN CLK. The next pulse on DEL CLK is delayed by the delay line 103 for about 31/32*TSRC from time t7 to a time tf2 just prior to the next rising edge of SRC CLK at time t8. The DFF 111 is clocked at time tf2 so that the OUT CLK signal goes high. At the next rising edge of SRC CLK at time t8, the COUNT value goes to 1 and the accumulator 113 asserts the WRAP signal, so that the counter 115 will count to 2 before overflowing back to 0 at about time t10. Operation proceeds in this manner.

The particular configuration and timing is exemplary only. In an alternative embodiment, the WIN CLK signal is asserted when the COUNT value is 1 instead of zero, so that the TS value is setup before WIN CLK traverses the delay line. In this alternative case, the WIN CLK, DEL CLK, and OUT CLK signals are all shifted one SRC CLK cycle to the left. The period of the OUT CLK is fractionally divided in substantially the same manner.

The resulting period TSRC of the OUT CLK signal is N.R times the period TSRC of SRC CLK as intended. If TSRC is 1.6 nanoseconds (ns) and N.R is 5.3125, then the period of TOUT is 8.5 ns. The first falling edge of the OUT CLK at time tf1 occurs at 4.25 ns after time t0, the next rising edge at time tr2 occurs at 8.5 ns after time t0, the next falling edge at time tf2 occurs at 12.75 ns after time to, and so on. Theoretically, the clock synthesizer 100 operates for a full range of divide ratios between 1.0 to a predetermined maximum value of N.R depending only on the bit widths for N and R if all mathematical calculations were instantaneous in implementation. The architecture of the clock synthesizer 100, however, does not support N.R values less than 2.0 where there is a new phase-offset clock required every cycle, or even twice a cycle depending on the divide ratio. Also, modern electronic device circuitry operates using both edges of the clock signal so that there is a 50% duty cycle for OUT CLK. Because of the 50% duty cycle requirement for OUT CLK, this restriction applies for 1.0<(N.R)/2<2.0 as well, so that N.R is limited to values greater than or equal to 4.0. Thus, the clock synthesizer 100 is limited to applications in which the generated clocks have $\frac{1}{4}^{th}$ or less the frequency of the source clock. Wireless baseband applications, however, require multiple clocks generated independently for fractional divide ratios near 1, so that the clock synthesizer 100 is not suitable for such applications.

In configurations according to the present invention, a continuous clock signal having a zero degree phase shift relative to SRC CLK is provided to the input of the delay line. The divide ratio N.R is divided by $2^M$ to a new value $N_{NEW}.R_{NEW}$ such that $N_{NEW}=0$ and only the fractional value $R_{NEW}$ remains. An accumulator adds the $R_{NEW}$ value to its internal sum for every cycle and is instead clocked by DEL CLK at the output of the tap select logic (e.g., MUX). Dividing N.R by $2^M$ is equivalent to converting N.R to a binary value N.Rb (in which "b" appended to a signal name denotes a binary value) and right shifting N.Rb until only a fraction value 0.NRb remains such that the integer portion is zero. In this case, $R_{NEW}$ is equal to 0.NRb and the number of binary right shifts to achieve this result is equal to M. Furthermore, the divide-by-two output logic (e.g., DFF) providing the OUT CLK is clocked at a frequency of SRC CLK divided by $2^{M-1}$. In one embodiment, this is achieved by dividing SRC CLK by $2^{M-1}$ and providing the divided clock to the input of the delay line. In another embodiment, this is achieved by counting $2^{M-1}$ cycles of DEL CLK before enabling the divide-by-two output logic.

Figure 3:
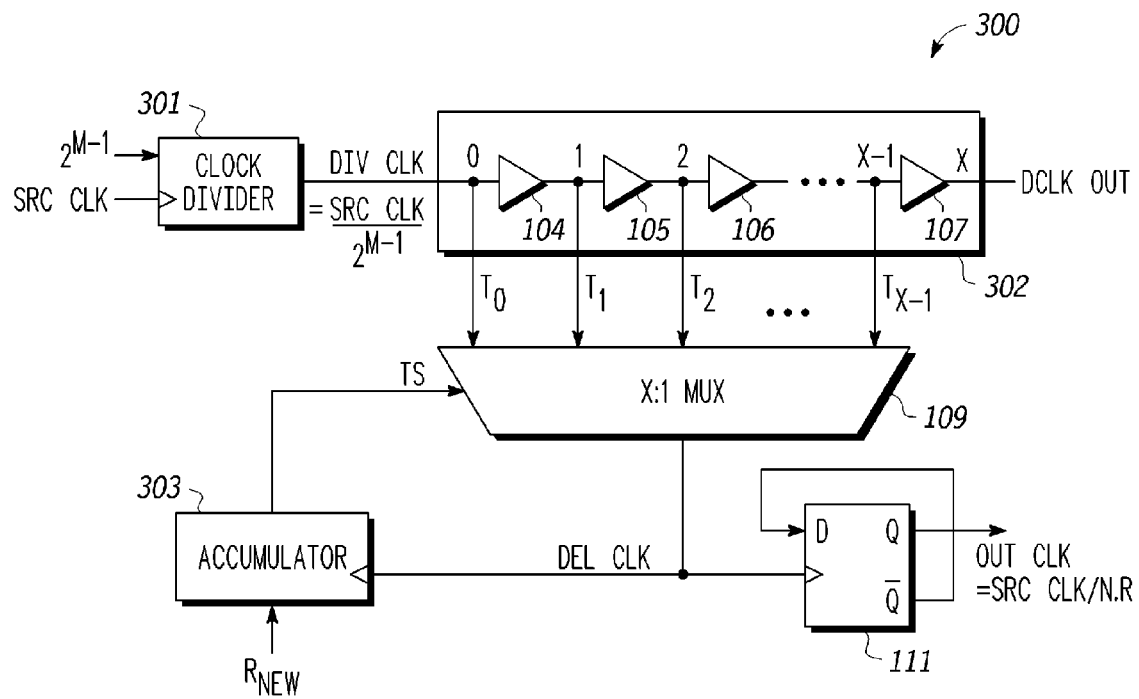
FIG. 3 is a block diagram of an exemplary clock synthesizer implemented according to an embodiment of the present invention.

FIG. 3 is a block diagram of an exemplary clock synthesizer 300 implemented according to an embodiment of the present invention. Similar components as those used for the clock synthesizer 100 assume identical reference numbers. The MUX 109 and the DFF 111 are included and are substantially unmodified and operate in the same manner. The delay line 103 is replaced with a delay line 302 with modified tap enable logic as further described below. The accumulator 113 is replaced with a similar accumulator 303 which operates in a similar manner but does not perform the wrap function. The SRC CLK signal is provided to the clock input of a clock divider 301, which receives a divide value $2^{M-1}$ at another input. The clock divider 301 divides the SRC CLK signal by $2^{M-1}$ to generate a signal DIV CLK, which is provided to the input of the delay line 302. The DIV CLK signal is a continuous clock signal having a zero degree phase shift relative to SRC CLK. The tap values $T_0$–$T_{X-1}$ are provided to respective inputs of the MUX 109, which provides the DEL CLK signal at its output. The DEL CLK is provided to the clock inputs of the DFF 111 and the accumulator 303, which receives the $R_{NEW}$ value at its load input and which provides the TS value at its output to the select input of the MUX 109. The accumulator 303 is clocked by DEL CLK and adds the $R_{NEW}$ value to its internal sum for every cycle of DEL CLK. The accumulator 303 updates the TS value with each cycle of DEL CLK and overflow values are discarded or otherwise ignored.

Figure 4:
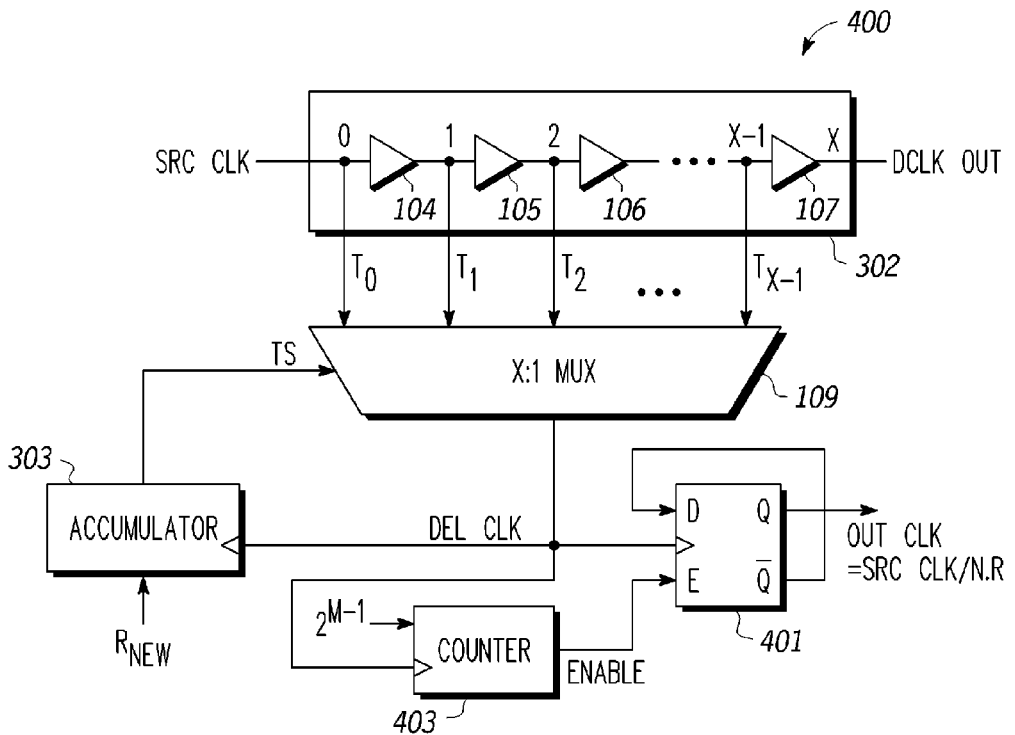
FIG. 4 is a block diagram of an exemplary clock synthesizer implemented according to another embodiment of the present invention.

FIG. 4 is a block diagram of an exemplary clock synthesizer 400 implemented according to another embodiment of the present invention. The clock synthesizer 400 is substantially similar to the clock synthesizer 300 in which similar components assume identical reference numbers. The clock synthesizer 400 includes the delay line 302, the MUX 109 and the accumulator 303 which operate in substantially the same manner as those described for the clock synthesizer 300. In this case, the clock divider 301 is eliminated and the SRC CLK is provided directly to the input of the delay line 302. The DFF 111 is replaced with a similar DFF 401 which operates in a similar manner but which further includes an enable (E) input. The DFF 401 toggles the OUT CLK signal only while enabled and when clocked by DEL CLK. A counter 403 is included which receives the DEL CLK signal at its clock input and which receives the divide value $2^{M-1}$ at another input. The counter 403 has an output providing an ENABLE signal to the enable input of the DFF 401. The counter 403 counts $2^{M-1}$ cycles of DEL CLK and thus increments with each rising edge of DEL CLK until it reaches $2^{M-1}-1$ and then wraps back to zero. When the counter 404 reaches its maximum value $2^{M-1}-1$, it asserts the ENABLE signal to allow the DFF 401 to be clocked by DEL CLK.

Figure 5:
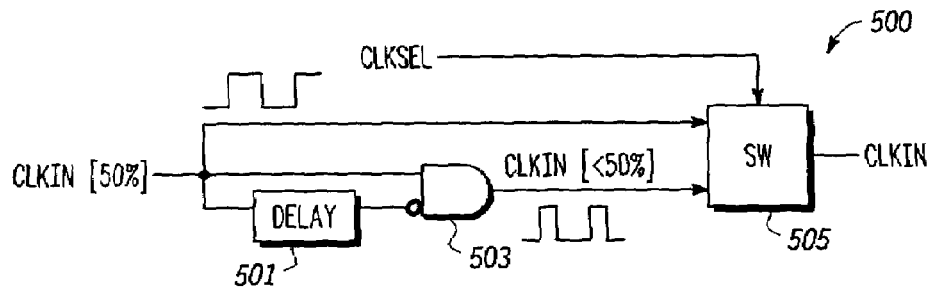
FIG. 5 is a block diagram of a duty cycle reduction circuit that may be used to reduce the duty cycle of the DIV CLK provided to the delay line of the clock synthesizer of FIG. 3 or to reduce the duty cycle of source clock signal provided to the delay line of the clock synthesizer of FIG. 4.

FIG. 5 is a block diagram of a duty cycle reduction circuit 500 that may be used to reduce the duty cycle of the DIV CLK provided to the delay line 302 for the clock synthesizer 300 or to reduce the duty cycle of SRC CLK provided to the delay line 302 for the clock synthesizer 400. The clock synthesizers 300 and 400 may be used to divide an input clock, e.g., the SRC CLK, by any fractional value greater to or equal to one. When the divide ratio approaches one, however, the 50% duty cycle of the input clock to the delay line 103 potentially causes glitches on the DEL CLK. The duty cycle reduction circuit 500 reduces the duty cycle of the input clock to an acceptable level to eliminate such glitches and to ensure error-free operation. A clock signal CLKIN [50%] is shown to represent either the DIV CLK used for the clock synthesizer 300 or the SRC CLK used for the clock synthesizer 400, each having a 50% duty cycle. The CLKIN [50%] is provided to the input of a delay circuit 501, to one input of a two-input AND gate 503, and to one selectable input of a switch circuit 505. The output of the delay circuit 501 is provided to the second input of the AND gate 503, which is shown as an inverting input. Alternatively, the delay circuit 501 may provide an inverted output or a separate inverter may be included. The delay circuit 501 delays the CLKIN [50%] signal by a predetermined or programmable delay and then provides its output to the AND gate 503. The AND gate 503 has an output providing a CLKIN [<50%] signal to a second selectable input of the switch circuit 505, where the CLKIN [<50%] signal has a duty cycle that is less than 50% as determined by the amount of delay through the delay circuit 501. The switch circuit 505 receives a clock select signal CLKSEL for selecting either the CLKIN [50%] or CLKIN [<50%] as the output clock signal CLKIN provided to the input of the delay line 302. The CLKIN [50%] is selected to simply pass the 50% duty cycle input signal unmodified to the delay line 302, such as for N.R ratios significantly greater than 1, whereas the CLKIN [<50%] signal is selected if the N.R ratio approaches 1. It is noted that the switch circuit 505 may be eliminated since the CLKIN [<50%] signal may be used for all values of N.R.

The delay circuit 501 may be implemented in any suitable manner as known to those skilled in the art, such as a series of buffers or inverters similar to the delay line. In fact, the delay circuit 501 may further include programmable taps to program its delay based on the selected frequency of CLKIN [50%] to ensure the desired level of duty cycle reduction. In operation, a rising edge of the CLKIN [50%] signal causes a rising edge of the CLKIN [<50%] at the output of the AND gate 503. After the delay through the delay circuit 501, which is typically less than half the period of the CLKIN [50%] signal, the CLKIN [<50%] is asserted low and stays low until CLKIN [50%] next goes high. An exemplary delay is approximately 25% of the period of the CLKIN [50%] signal to achieve at 25%/75% duty cycle for the CLKIN signal.

The clock synthesizer 100 employs a window clock whereas the clock synthesizers 300 and 400 employ a free running clock input to the delay line. The delay line 103 is suitable for a window clock configuration. When a free running clock is input to the delay line and the accumulator 303 is updated every cycle of the DEL CLK signal, however, it is possible that a tap of the delay line 103 is enabled early while still high from a previous pulse. The tap enable mechanism of the delay line 302 is modified to ensure glitch-less enables for the phase-shifted clocks.

Figure 6:
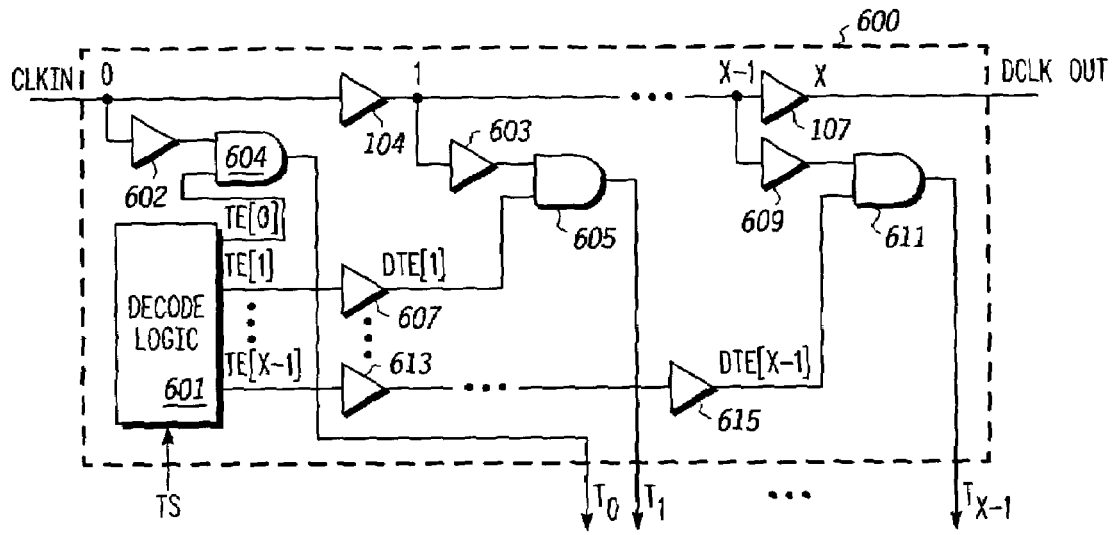
FIG. 6 is a block and schematic diagram of a delay line that illustrates a first configuration of the delay line of FIGS. 3 and 4 to minimize glitches on the enable signals.

FIG. 6 is a block and schematic diagram of a delay line 600 that illustrates a first configuration of the delay line 302 to minimize glitches on the enable signals. The delay line 600 includes tap enable logic that delays the tap enable signals by approximately the same delay as the clock signal propagating through the delay line. The buffers 104–107 are coupled in the same manner between the CLKIN signal and the DCLK OUT signal. The TS value is applied to an input of decode logic 601, providing tap enable signals TE[0]–TE[X−1] for enabling tap signals 0 to X−1, respectively. Tap 0 is provided to the input of a buffer 602, having an output provided to one input of a two-input AND gate 604. The other input of the AND gate 604 receives TE[0], and its output is provided as the tap signal $T_0$ and is not delayed. A buffer 603 has its input coupled to tap 1 and an output coupled to one input of a two-input AND gate 605, having its output providing the $T_1$ tap signal. Another buffer 607 has an input receiving TE[1] and an output providing a delayed tap enable signal DTE[1] to the other input of the AND gate 605. The delay of the buffer 607 is configured to be substantially the same as the buffer 104 so that DTE[1] is delayed by approximately the same amount as the clock signal propagating to tap 1, so that the tap signal $T_1$, if selected, is not enabled prematurely. A buffer 609 and AND gate 611 are configured and coupled in substantially the same manner for enabling tap X−1. In this case, a series of X−1 buffers 613–615 are coupled in series between tap enable signal TE[X−1] and a delayed tap enable signal DTE[X−1], which is provided to the other input of the AND gate 611. In this manner, the total delay of the series of buffers 613–615 is configured to be substantially the same as the series of buffers between tap 0 and tap X−1 so that DTE[X−1] is delayed by approximately the same amount as the clock signal propagating to tap X−1. Thus, the tap signal $T_{X-1}$, if selected, is not enabled prematurely. Each of the taps 2 through X−2 have similar enable logic so that each enable signal TE[2]–TE[X−2] is delayed by approximately the same amount as the clock signal propagating to the corresponding tap 2 through X−2, respectively.

The enable logic of the delay line 600 is intended to provide the same theoretical delay for each enable signal as for the phase-shifted clock output. This approach, however, consumes noticeable additional area since every enable signal must have a delay line or partial delay line in addition to the delay line used to generate the phase-shifted clocks. Furthermore, the actual delay of the tap enable signals will not match the phase-shifted clocks since traveling through a physically different buffer path. The buffer delays are dynamically modified in the delay locked loop, and the same loop control mechanism is applied to the tap enable delay buffers to minimize error. Although it is possible to match two buffers fairly closely for a given voltage and temperature, variations occur with changes in voltage and temperature over time. Such errors are accumulated over multiple buffers so that delay matching between the clocks and tap enables towards the end of the delay line is difficult.

Figure 7:
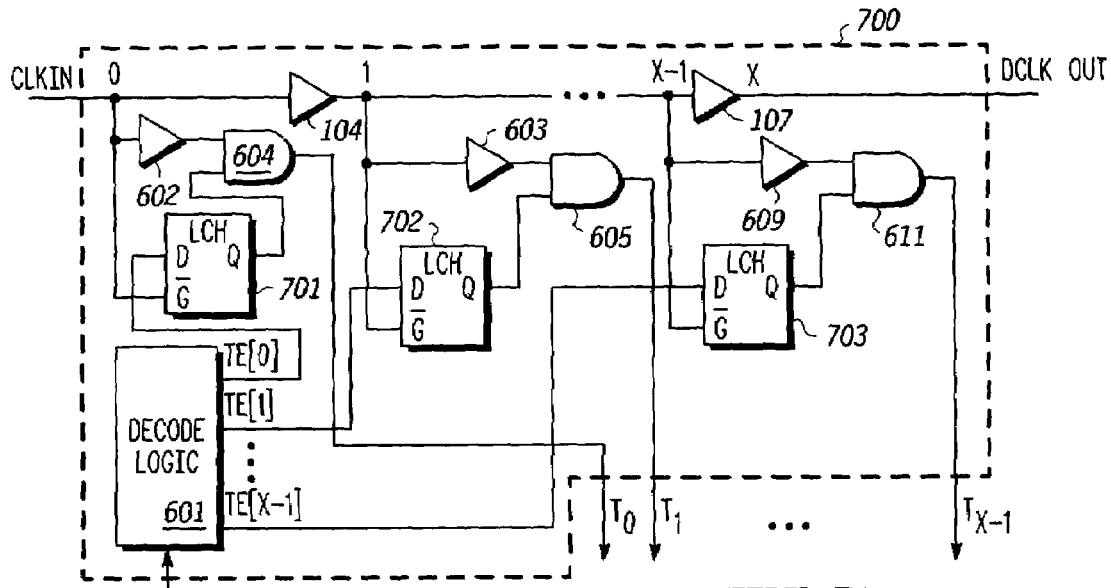
FIG. 7 is a block and schematic diagram of another delay line that may be used as the delay line of FIGS. 3 and 4 to minimize glitches on the DEL CLK signal due to the enable signals changing state.

FIG. 7 is a block and schematic diagram of another delay line 700 that may be used as the delay line 302 to minimize glitches on the DEL CLK signal due to the enable signals changing state. The delay line 700 includes enable logic that effectively guarantees that the enable signals are stable the cycle that the source clock is activated to travel down the delay line 302. Each of the taps 0 through X−1 includes a buffer and an AND gate in the same manner as the delay line 600. In this case, a series of X D-type latches 701, 702, . . . , 703 are provided, each having an inverted enable input ("Gbar" or G with a bar over top indicating an active low input) coupled to a respective one of the taps 0 through X−1. The latches 701–703 also include a D input receiving a respective one of the tap enable signals TE[0]–TE[X−1] from the decode logic 601 decoding the TS value. The latches 701–703 further include a Q output coupled to the other input of a respective one of the AND gates for each of the taps 0 through X−1. Each latch holds its value preventing premature enablement if the corresponding delay line tap is high, and then allows the corresponding enable signal to enable the tap when the tap goes low. In addition, the latch configuration allows the delay line 700 to generate X number of edges off of one source clock restricted only by the speed of the implementation.

Figure 8:
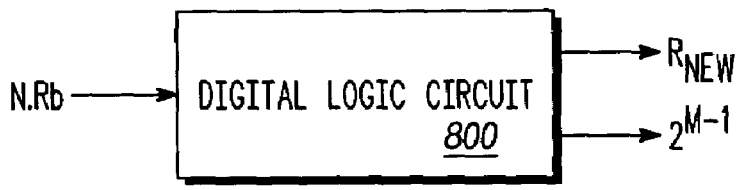
FIG. 8 is a block diagram of an exemplary digital logic circuit used to derive RNEW and 2M−1 based on the fractional divide ratio N.Rb (as a binary value)
Figure 9:
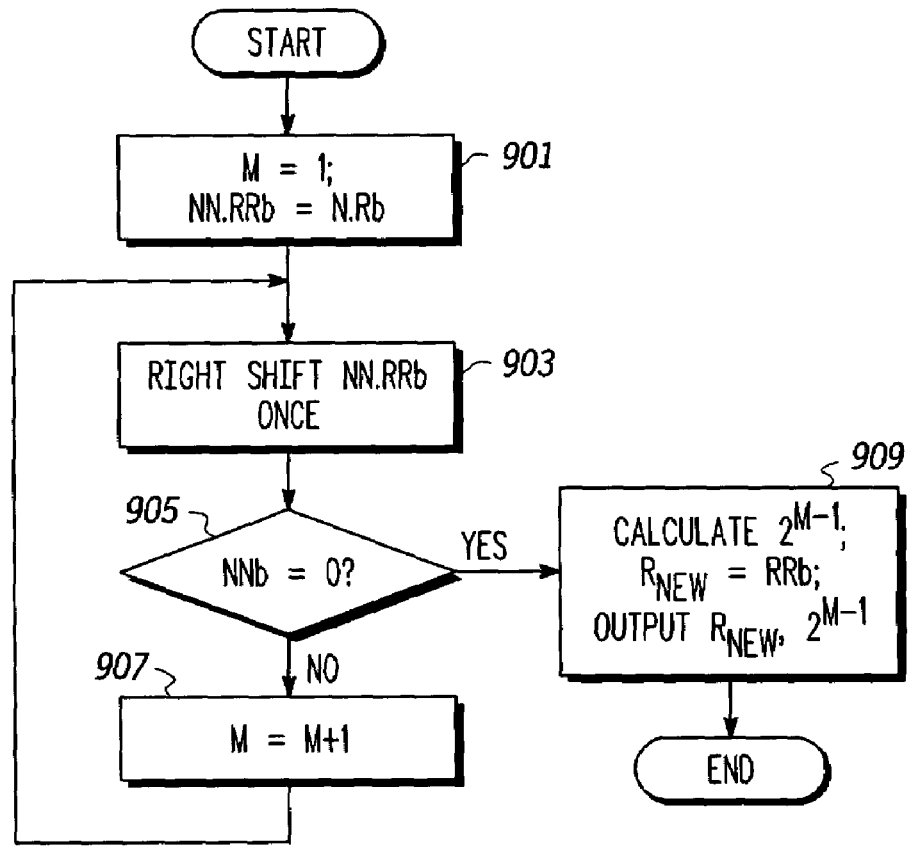
FIG. 9 is a simplified flow chart diagram illustration operation of the digital logic circuit of FIG. 8.

FIG. 8 is a block diagram of an exemplary digital logic circuit 800 used to derive $R_{NEW}$ and $2^{M-1}$ based on the fractional divide ratio N.Rb (as a binary value). FIG. 9 is a simplified flow chart diagram illustration operation of the digital logic circuit 800. At a first block 901, the shift value M is initialized to 1 since it is assumed that N.Rb is greater than or equal to one and will be right-shifted at least once. Also, a dummy value NN.RRb is set equal to N.Rb for purposes of the shift operation. For example, a copy of N.Rb is loaded into a shift register or the like. At next block 903, NN.RRb is right-shifted once to provide a new value for NN.RRb. At next block 905, it is queried whether the binary value NNb is zero. If not, then additional right-shift operations are necessary and operation proceeds to block 907 in which M is incremented by one. Then operation returns back to block 903 to right shift NN.RRb again. Operation loops between blocks 903 905 and 907 until NNb becomes zero as determined at block 905. When NNb=0, operation proceeds to block 909 in which $2^{M-1}$ is calculated and $R_{NEW}$ is set equal to RRb. The values $R_{NEW}$ and $2^{M-1}$ are output to the clock synthesizer for dividing the source clock by N.R. It is appreciated that right shifting N.Rb until N=0 is equivalent to dividing the decimal value N.R by $2^M$.

Figure 10:
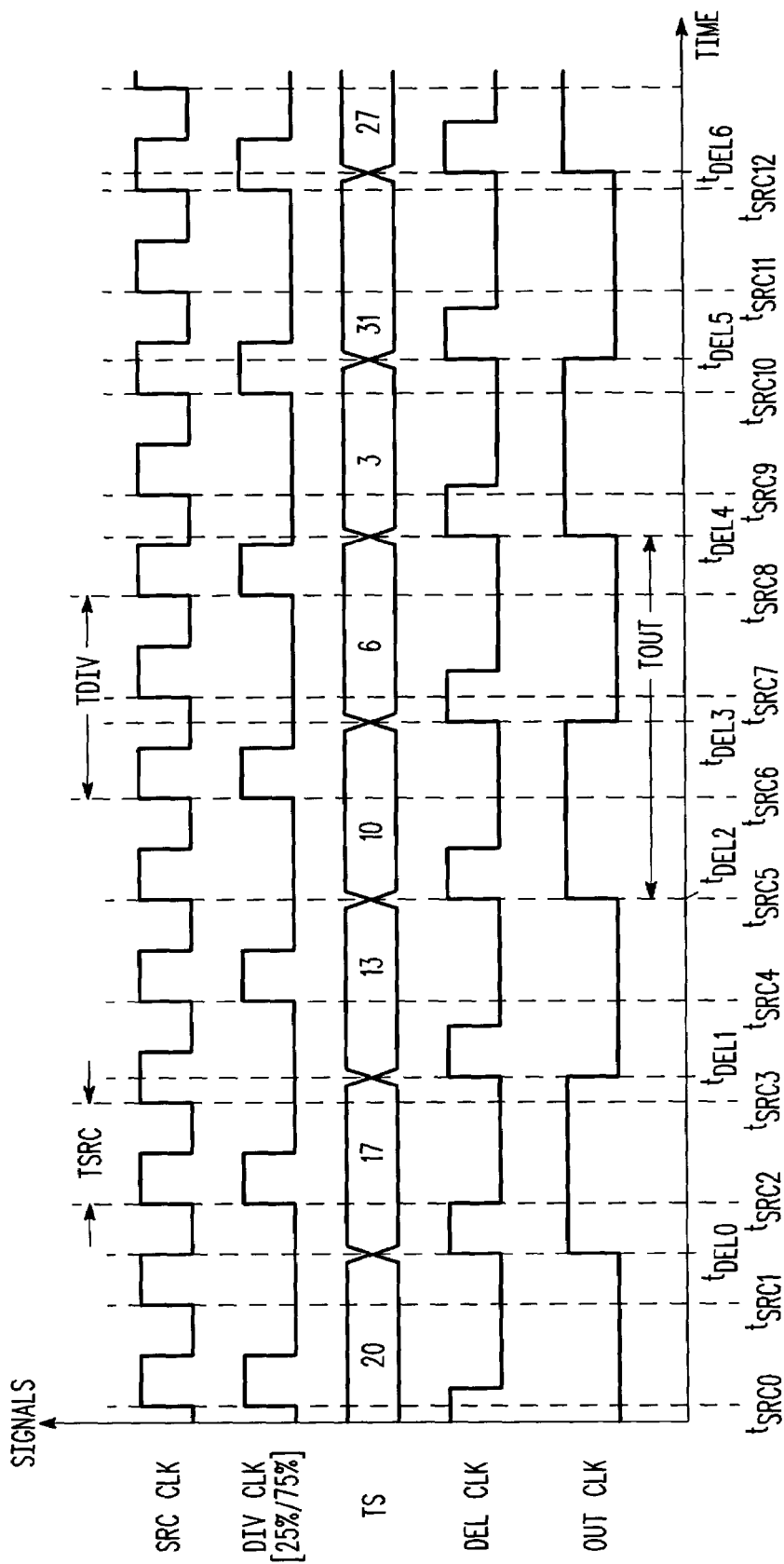
FIG. 10 is a timing diagram illustrating operation of the clock synthesizer of FIG. 3 for the specific case when N.R=3.55399996.

FIG. 10 is a timing diagram illustrating operation of the clock synthesizer 300 for the specific case when N.R=3.55399996. In this case, the binary representation is N.Rb=0000_0011.1000_1101_1101_0010_1111_0001b, which is right-shifted 2 times so that $N_{NEW}$=0 to achieve a new fractional value $R_{NEW}$=1110_0011_0111_0100_1011_1100b for a shift value M=2. The binary $R_{NEW}$ value corresponds to a digital value of 0.8884999752044677734375, which converts to 28.43199920654296875 for the modulo-32 function. The SRC CLK is divided by the clock divider 301 by $2^{M-1}$=2 and the $R_{NEW}$ value is added to the internal sum of the accumulator 303 with each clock pulse of the DEL CLK signal. In one embodiment, the five MSB's of the binary value are used to determine the tap sequence and the lower bits are ignored to achieve a tap sequence of 28, 24, 21, 17, 14, 10, 7, 3, 31, 28, and so on. Alternatively, the accumulator 303 uses the 6$^{th}$ MSB to round up to reduce error, so that the tap sequence becomes 28, 25, 21, 18, 14, 11, 7, 3, 32, 28, and so on for a slightly more accurate result. The sequence illustrated in FIG. 8 begins after many iterations so that the TS values are different though the sequence between the numbers is the same.

The SRC CLK is divided by $2^{M-1}$=2 by the clock divider 301 to generate the DIV CLK. The DIV CLK is further processed through the duty cycle reduction circuit 500 to provide the DIV CLK [25%/75%] signal provided to the input of the delay line 302. The total delay through the delay line 302 is one full clock cycle of the DIV CLK signal, which has a period of TDIV. The SRC CLK, DIV CLK [25%/75%], TS, DEL CLK and OUT CLK signals or valuus are plotted versus time for 12 cycles of SRC CLK and 5 cycles of the DIV CLK [25%/75%] signal. The SRC CLK signal goes high at times $t_{SRC0}$, $t_{SRC1}$, . . . , $t_{SRC12}$, etc., and the DIV CLK [25%/75%] signal goes high every other cycle of SRC CLK at times $t_{SRC0}$, $t_{SRC2}$, $t_{SRC4}$ . . . , $t_{SRC120}$, etc. The OUT CLK is initially low at time $t_{SRC0}$ and DIV CLK [25%/75%] is pulsed high while the TS value is 20, so that the T20 tap signal is selected. Thus, after a delay of (20/32)*TDIV from time $t_{SRC0}$, plus any additional delay of the circuitry, the DEL CLK signal goes high at time $t_{DEL0}$. When the DEL CLK signal goes high at time $t_{DEL0}$, the OUT CLK goes high and the accumulator 303 updates the TS value to 17. DIV CLK [25%/75%] next goes high at time $t_{SRC2}$ while the TS value is 17, so that the DEL CLK signal next goes high at time $t_{DEL1}$ after a delay of (17/32)*TDIV from time $t_{SRC2}$. When the DEL CLK signal goes high at time $t_{DEL1}$, the OUT CLK goes low and the accumulator 303 updates the TS value to 13. DIV CLK [25%/75%] next goes high at time $t_{SRC4}$ while the TS value is 13, so that the DEL CLK signal next goes high at time $t_{DEL2}$ after a delay of (13/32)*TDIV from time $t_{SRC4}$. When the DEL CLK signal goes high at time $t_{DEL2}$, the OUT CLK goes high again and the accumulator 303 updates the TS value to 10. Operation proceeds in this manner to generate the CLK OUT signal having a 50% duty cycle and with a period that is 3.55399996 times the period of SRC CLK.

Figure 11:
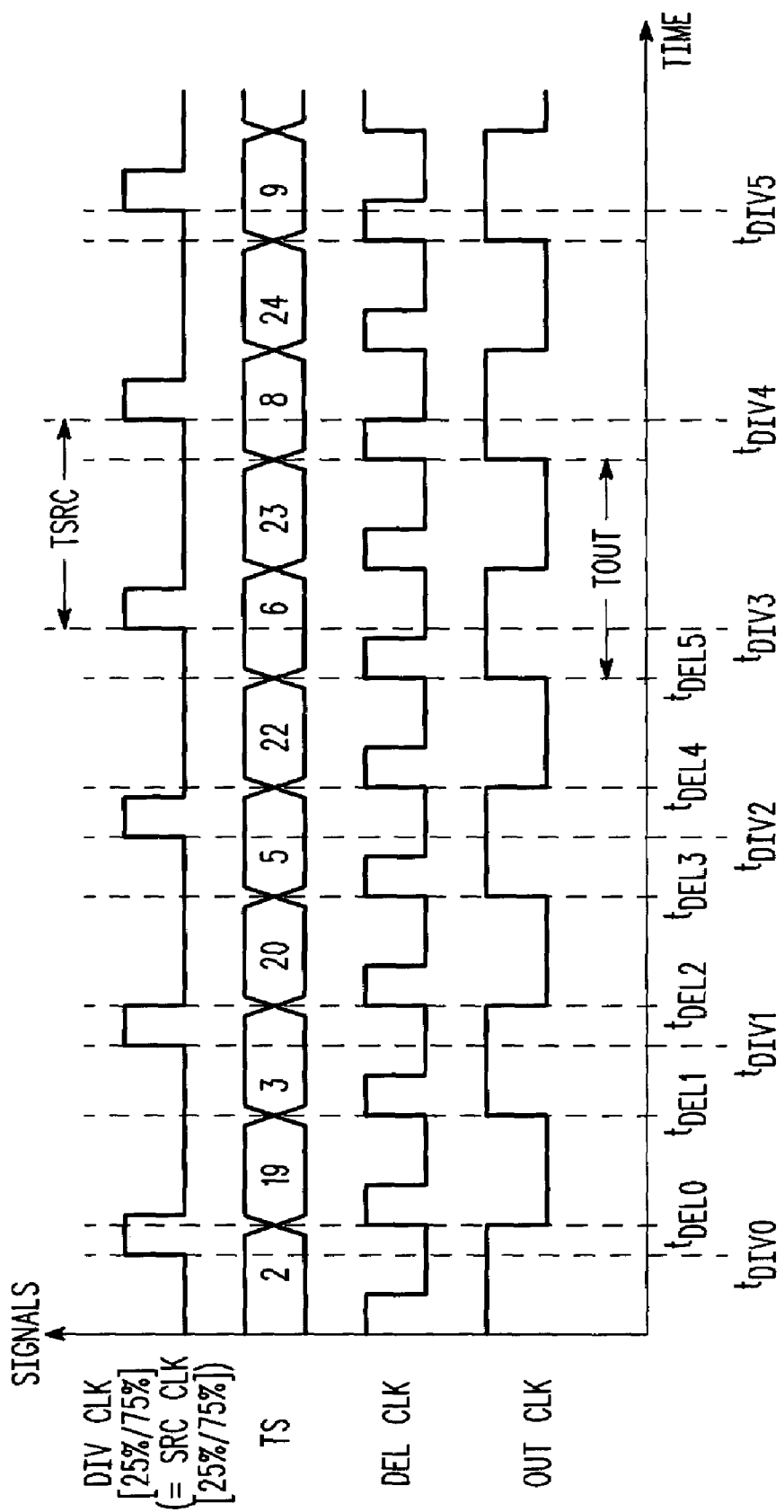
FIG. 11 is a timing diagram illustrating operation of the clock synthesizer of FIGS. 3 and 4 for the specific case when N.R=1.04472506 and when the duty cycle reduction circuit of FIG. 5 is used to reduce the duty cycle of the input clock signal to the delay line.

FIG. 11 is a timing diagram illustrating operation of the clock synthesizer 300 for the specific case when N.R=1.04472506 and when the duty cycle reduction circuit 500 is used to convert the DIV CLK to the DIV CLK [25%/75%] signal. In this case, the binary representation is N.Rb=0000_0001.0000_1011_0111_0011_0001_1010b, which is right-shifted 1 time so that $N_{NEW}$=0 to achieve a new fractional value $R_{NEW}$=1000_0101_1011_1001_1000_1101b for a shift value M=1. The binary $R_{NEW}$ value corresponds to a digital value of 0.5223625302, which converts to approximately 16.7156 for the modulo-32 function. The SRC CLK is not divided by the clock divider 301 in this case since $2^{M-1}=1$, so that DIV CLK [25%/75%] has the same period TSRC as SRC CLK. The $R_{NEW}$ value is added to the internal sum of the accumulator 303 with each clock pulse of the DEL CLK signal, and the $6^{th}$ MSB is used to determine whether to round up to the next tap select value.

The DIV CLK [25%/75%], TS, DEL CLK and OUT CLK signals or values are plotted versus time for five cycles of the DIV CLK [25%/75%] signal. The DIV CLK [25%/75%] signal goes high at times $t_{DIV0}$, $t_{DIV1}$, $t_{DIV2}$, $t_{DIV3}$, $t_{DIV4}$, and $t_{DIV5}$. The OUT CLK is initially high at time $t_{DIV0}$. The TS value is 2 from a previous cycle so that the pulse on the DIV CLK [25%/75%] signal beginning at time $t_{DIV0}$ causes a corresponding pulse beginning at time $t_{DEL0}$ on the DEL CLK signal after 2 delays through the delay line 103 since tap 2 is selected. The rising edge of DEL CLK causes the accumulator 303 to update the TS value to 19 at time $t_{DEL0}$ and clocks the DFF 111 so that the OUT CLK goes low. The pulse at time $t_{DIV0}$ on DIV CLK [25%/75%] continues to propagate to the $19^{th}$ tap and causes another pulse on the DEL CLK beginning at time $t_{DEL0}$, which clocks the DFF 111 again so that the OUT CLK goes high again. Also, the accumulator 303 updates to provide a new TS value of 3. It is appreciated that the same pulse at time $t_{DIV0}$ on DIV CLK [25%/75%] causes two pulses on the DEL CLK during the same DIV CLK cycle since the tap is updated to a later tap on the delay line 103, and that each pulse on DEL CLK causes a transition of OUT CLK.

The DIV CLK [25%/75%] next goes high at time $t_{DIV1}$ while the TS value is 3, which causes a corresponding pulse beginning at time $t_{DEL2}$ on the DEL CLK signal after 3 delays through the delay line 103 since tap 3 is selected. The OUT CLK goes low and the accumulator 303 updates the TS value to 20, which results in another pulse on DEL CLK at time $t_{DEL3}$ before time $t_{DIV2}$ caused by the same DIV CLK [25%/75%] signal pulse. The pulse on DEL CLK at time $t_{DEL3}$ causes the OUT CLK to go high again and the accumulator 303 to update the TS value to 5 as shown. Operation proceeds in the same manner in the next cycle of DIV CLK [25%/75%] beginning at time $t_{DIV2}$, where the DIV CLK pulse results in two more DEL CLK pulses at times $t_{DEL4}$ and $t_{DEL5}$ and corresponding transitions of the OUT CLK signal.

Operation proceeds in the same manner for subsequent cycles providing the OUT CLK having a period TOUT that is approximately 1.04472506 times the period TSRC of the SRC CLK (being the same as the DIV CLK). In this case, the OUT CLK is slightly delayed relative to DIV CLK and DIV CLK has the same period as SRC CLK but with a reduced duty cycle for ensuring glitch-free operation of the delay line 103. Also, the delay line 103 is configured according to either delay line 600 or delay line 700 to prevent glitches on the DEL CLK.

The timing diagram of FIG. 11 also illustrates operation of the clock synthesizer 400 for the same divide value of N.R=1.04472506. The SRC CLK is provided through the duty cycle reduction circuit 500 in similar manner to provide DIV CLK [25%/50%]. Since $2^{m-1}=1$ for M=2, the counter 403 does not count cycles but instead keeps the ENABLE signal high, so that the DFF 401 is always enabled just like the DFF 111. In this manner, the TS values, the DEL CLK signal and the OUT CLK signal shown in FIG. 4 are the same for the clock synthesizers 300 and 400.

Figure 12:
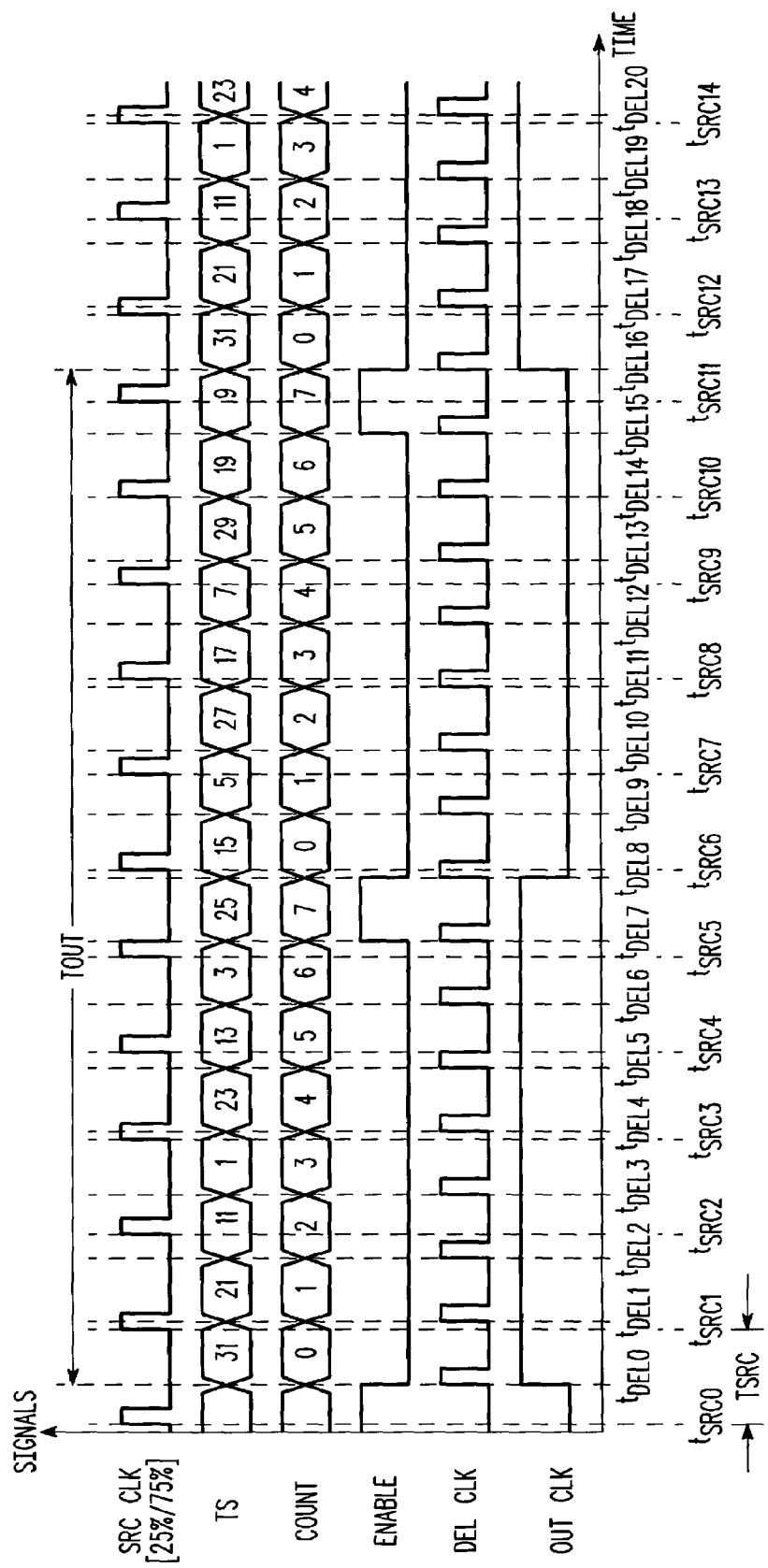
FIG. 12 is a timing diagram illustrating operation of the clock synthesizer of FIG. 4 for the specific case when N.R=10.9999994 and when the duty cycle reduction circuit of FIG. 5 is used to reduce the duty cycle of the source clock signal provided to the delay line.

FIG. 12 is a timing diagram illustrating operation of the clock synthesizer 400 for the case when N.R=10.9999994 and when the duty cycle reduction circuit 500 is used to convert the SRC CLK to a signal SRC CLK [25%/75%]. In this case, the binary representation of N is 1010b so that N.Rb is right-shifted 4 times until $N_{NEW}=0$. Also, M=4 and $2^{M-1}=8$ so that the counter 403 counts from 0 to 7 upon successive cycles of the DEL CLK. The ENABLE signal provided to the DFF 401 goes high when the COUNT value (COUNT value) is equal to 7 and is otherwise low. The binary value of $R_{NEW}$ is calculated in similar manner (not shown) and the modulo-32 function is applied to achieve the TS values shown upon successive cycles of the DEL CLK signal. The $R_{NEW}$ value is added to the internal sum of the accumulator 303 with each clock pulse of the DEL CLK signal, and the $6^{th}$ MSB is used to determined whether to round up to the next tap select value.

In FIG. 12, the SRC CLK [25%/75%], TS, COUNT, ENABLE, DEL CLK and OUT CLK signals or values are plotted versus time for fourteen cycles of SRC CLK. The SRC CLK [25%/75%] signal goes high at each of times $t_{SRC0}$–$t_{SRC14}$ and the DEL CLK goes high at each of times $t_{DEL0}$–$t_{DEL20}$. The ENABLE signal is initially high from the previous cycle, so that when the DEL CLK next goes high at time $t_{DEL0}$ after time $t_{SRC0}$, the OUT CLK goes high, the COUNT value is updated to 0, the TS value is updated to 31, and the ENABLE signal goes back low. Each pulse on the SRC CLK [25%/75%] results in one or two pulses on the DEL CLK in a similar manner as previously described. The COUNT value increments and the TS value is updated with each rising edge of the DEL CLK for each of times $t_{DEL0}$–$t_{DEL6}$ while the enable signal remains low, so that the OUT CLK remains high. When the DEL CLK signal next goes high at time $t_{DEL7}$, the counter 403 increments the COUNT value to 7 and asserts the ENABLE signal high. The ENABLE signal is slightly delayed relative to the DEL CLK signal so that the DFF 401 does not register the clock edge. When the DEL CLK signal next goes high at time $t_{DEL8}$ while the ENABLE signal is still high, the DFF 401 registers the clock edge and pulls the CLK OUT signal low. Meanwhile, the counter 403 overflows and changes the COUNT value back to 0 and the ENABLE signal goes back low. Operation proceeds in this manner until a rising edge of the DEL CLK signal at time $t_{DEL16}$ causes the DFF 401 to pull the CLK OUT signal high again to complete one cycle of CLK OUT from time $t_{DEL0}$. Operation proceeds in the same manner for subsequent cycles. In this manner, the period TOUT of the OUT CLK signal is about 10.9999994 times the period TSRC of the SRC CLK signal.

In a first aspect of the present invention, a clock synthesizer that divides a source clock by a fractional divide ratio N.R which is at least one includes a logic circuit, a delay line, a select circuit, an accumulator and a first clock divider circuit. The logic circuit divides the fractional divide ratio N.R by $2^M$ to provide a new digital value NNEW.RNEW in which the NNEW value is zero and the RNEW value is at least 0.5. The delay line has an input receiving a first clock and multiple delay taps, where the first clock has a frequency based on the frequency of the source clock. The select circuit has selectable inputs coupled to the delay taps of the delay line, a select input receiving a tap select value, and an output providing a delay clock. The accumulator adds the RNEW value to a sum value for each cycle of the delay clock and performs a modulo function on the sum value to generate the tap select value. The first clock divider circuit transitions an output clock based on selected transitions of the delayed clock, where the selected transitions are based on dividing the frequency of the source clock by $2^{M-1}$.

In one embodiment, the first clock has the same frequency as the source clock. In this case, the first clock divider circuit includes a counter and a divide-by-two circuit. The counter has a clock input receiving the delay clock and an output providing an enable signal every $2^{M-1}$ cycles of the delay clock. The divide-by-two circuit has a clock input receiving the delay clock, a data input coupled to an inverting output, an enable input receiving the enable signal, and a non-inverting output providing the output clock. In one specific embodiment, the source clock itself is provided to the input of the delay line. In another embodiment, a duty cycle reduction circuit is included, which receives the source clock and which generates the first clock with a reduced duty cycle.

In another embodiment, a second clock divider circuit is provided which has a clock input for receiving the source clock and an output providing the first clock with a frequency that is equal to the source clock frequency divided by $2^{M-1}$. In this case, the first clock divider circuit is a flip flop which has a clock input receiving the delay clock, a data input coupled to an inverting output, and a non-inverting output providing the output clock. The second clock divider may include a duty cycle reduction circuit which reduces a duty cycle the first clock provided to the input of the delay line.

In various configurations, the accumulator uses a number of most significant bits of the RNEW value for the modulo function commensurate with a number of delay taps of the delay line. In a more accurate embodiment, accumulator uses an additional most significant bit of the RNEW value for the modulo function for rounding the tap select value. The delay line may include decode logic and latches. The delay logic receives and converts the tap select value into corresponding tap enable signals. Each latches has a data input receiving a corresponding tap enable signal, an enable input coupled to a corresponding delay tap, and a tap enable output.

In another aspect of the present invention, the clock synthesizer includes a logic circuit which right shifts a binary fractional divide value N.R a number M times to provide a new digital value NNEW.RNEW in which the NNEW value is zero and in which a most significant bit of the RNEW value is 1. The delay line, select circuit, accumulator and clock circuit are also included.

A method of dividing a source clock by a fractional divide ratio N.R according to an embodiment of the present invention includes dividing the fractional divide ratio N.R by $2^M$ to provide a new digital value NNEW.RNEW in which the NNEW value is zero and the RNEW value is at least 0.5, providing a free-running first clock based on the source clock through a delay line having delay taps, selecting a delay tap based on a tap select signal and providing a delayed clock based on selected delay taps, accumulating the RNEW value for each cycle of the delayed clock to a sum value, performing a modulo function of the sum value to generate the tap select signal, and transitioning an output clock based on selected transitions of the delayed clock in which the selected transitions are based on dividing the frequency of the source clock by $2^{M-1}$.

In one embodiment, the method includes generating the first clock with the same frequency as the source clock, providing an enable signal every $2^{M-1}$ cycles of the delayed clock, and toggling the output clock during a transition of the delayed clock while the enable signal is provided. In an alternative embodiment, the method includes dividing a frequency of the source clock by $2^{M-1}$ to generate the first clock and toggling the output clock during each cycle of the delayed clock. The method may include reducing the duty cycle of the first clock provided to the delay line. The method may include delaying each tap enable of the delay line by approximately the same delay as the first clock propagating through the delay line to a corresponding delay tap. The method may include enabling each delay tap of the delay line when it is at a predetermined logic level.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention. Those of ordinary skill in the art will recognize that, based upon the teachings herein, several modifications may be made to the embodiments shown and described herein without departing from the spirit and scope of the invention. For example, the delay lines (e.g., 103, 302, 600, 700) are shown implemented with a series of non-inverting buffers, but may be implemented using other types of delay devices including inverters or the like. The multiplexer 109 may be replaced by any other suitable select logic or circuitry as known to those skilled in the art. The divide-by-two function for the DEL CLK is implemented using D-type flip flops (e.g., 111, 401), where it is understood that other types of divide-by-two circuitry may be used including different type flip flops, such as T-type or SR-type flip flops and the like. The counters 115 and 403 are described as counting up and returning to zero but may be replaced by down counters or the like. Positive logic implementations may be replaced with equivalent negative logic configurations.

What is claimed is:

1. A clock synthesizer that divides a source clock by a fractional divide ratio N.R which is at least one, comprising:
    a logic circuit which determines an integer M such that the fractional divide ratio N.R divided by $2^M$ to provides a new digital value NNEW.RNEW in which said NNEW value is zero and said RNEW value is at least 0.5;
    a delay line having an input receiving a first clock and having a plurality of delay taps, wherein said first clock has a frequency which is the frequency of the source clock divided by a first value;
    a select circuit having a plurality of selectable inputs coupled to said plurality of delay taps, a select input receiving a tap select value, and an output providing a delay clock;
    an accumulator which adds said RNEW value to a sum value for each cycle of said delay clock and that performs a modulo function on said sum value to generate said tap select value; and
    a first clock divider circuit that transitions an output clock based on selected transitions of said delay clock wherein said transitions are selected to divide the frequency of the delay clock by a second value in which said first value multiplied by said second value is $2^M$.

2. The clock synthesizer of claim 1, wherein said first clock has a frequency which is the same as the source clock, and wherein said first clock divider circuit comprises:
    a counter having a clock input receiving said delay clock and an output providing an enable signal every $2^{M-1}$ cycles of said delay clock; and
    a divide-by-two circuit having a clock input receiving said delay clock, a data input coupled to an inverting output, an enable input receiving said enable signal, and a non-inverting output providing said output clock.

3. The clock synthesizer of claim 2, wherein the source clock is provided as said first clock to said input of said delay line.

4. The clock synthesizer of claim 2, further comprising a duty cycle reduction circuit having an input for receiving the source clock and an output providing said first clock having the same frequency as the source clock.

5. The clock synthesizer of claim 2, wherein said divide-by-two circuit comprises a flip flop.

6. The clock synthesizer of claim 1, further comprising:
a second clock divider circuit having a clock input for receiving the source clock and an output providing said first clock with a frequency that is equal to the source clock frequency divided by $2^{M-1}$; and
wherein said first clock divider circuit comprises a flip flop having a clock input receiving said delay clock, a data input coupled to an inverting output, and a non-inverting output providing said output clock.

7. The clock synthesizer of claim 6, wherein said second clock divider circuit further comprises a duty cycle reduction circuit which reduces a duty cycle said first clock provided to said input of said delay line.

8. The clock synthesizer of claim 1, wherein said accumulator uses a number of most significant bits of said RNEW value for said modulo function commensurate with a number of said plurality of delay taps of said delay line.

9. The clock synthesizer of claim 8, wherein said accumulator uses an additional most significant bit of said RNEW value for said modulo function for rounding said tap select value.

10. The clock synthesizer of claim 1, wherein said delay line comprises:
decode logic that receives and converts said tap select value into a plurality of tap enable signals; and
a plurality of latches, each having a data input receiving a corresponding one of said plurality of tap enable signals, an enable input coupled to a corresponding one of said plurality of delay taps, and a tap enable output.

11. A clock synthesizer that divides a source clock by a binary fractional divide ratio N.R which is at least one, comprising:
a logic circuit which right shifts N.R an integer number M times to provide a new digital value NNEW.RNEW in which said NNEW value is zero and in which a most significant bit of said RNEW value is 1;
a delay line having an input receiving a first clock and having a plurality of delay taps, wherein said first clock has a frequency which is the frequency of the source clock divided by a first value;
a select circuit having a plurality of selectable inputs coupled to said plurality of delay taps, a select input receiving a tap select value, and an output providing a second clock;
an accumulator which adds said RNEW value to a sum value for each cycle of said second clock and that performs a modulo function on said sum value to generate said tap select value; and
a clock counter circuit that transitions an output clock based on selected transitions of said second clock wherein said transitions are selected to divide the frequency of the second clock by a second value in which the first value multiplied by the second value is $2^M$.

12. The clock synthesizer of claim 11, wherein said clock counter circuit comprises:
a counter having a clock input receiving said second clock and an output providing an enable signal every $2^{M-1}$ cycles of said second clock; and
a divide-by-two circuit having a clock input receiving said second clock, a data input coupled to an inverting output, an enable input receiving said enable signal, and a non-inverting output providing said output clock.

13. The clock synthesizer of claim 11, further comprising:
a clock divider circuit having a clock input for receiving the source clock and an output providing said first clock with a frequency that is equal to the source clock frequency divided by $2^{M-1}$; and
wherein said clock counter circuit comprises a divide-by-two circuit having a clock input receiving said second clock, a data input coupled to an inverting output, and a non-inverting output providing said output clock.

14. The clock synthesizer of claim 11, wherein said delay line comprises:
decode logic that receives and converts said tap select signal into a plurality of tap enable signals; and
a plurality of latches, each having a data input receiving a corresponding one of said plurality of tap enable signals, an enable input coupled to a corresponding one of said plurality of delay taps, and a tap enable output.

15. A method of dividing a source clock by a fractional divide ratio N.R which is at least one, comprising:
determining an integer M such that the fractional divide ratio N.R divided by $2^M$ provides a new digital value NNEW.RNEW in which the NNEW value is zero and the RNEW value is at least 0.5;
providing a free-running first clock through a delay line having a plurality of delay taps, wherein the first clock has a frequency that is the frequency of the source clock divided by a first value;
selecting one of the plurality of delay taps based on a tap select signal and providing a delayed clock based on selected delay taps;
accumulating the RNEW value for each cycle of said delayed clock to a sum value;
performing a modulo function of the sum value to generate the tap select signal; and
transitioning an output clock based on selected transitions of the delayed clock wherein the transitions are selected to divide the delayed clock by a second value in which the first and second values multiplied together is $2^M$.

16. The method of claim 15, wherein:
said providing a free-running first clock through a delay line comprises generating the first clock with the same frequency as the source clock; and
wherein said transitioning an output clock comprises:
providing an enable signal every $2^{M-1}$ cycles of the delayed clock; and
toggling the output clock during a transition of the delayed clock while the enable signal is provided.

17. The method of claim 15, wherein:
said providing a free-running first clock through a delay line comprises dividing a frequency of the source clock by $2^{M-1}$; and
wherein said transitioning an output clock comprises toggling the output clock during each cycle of the delayed clock.

18. The method of claim 15, further comprising reducing the duty cycle of the first clock provided to the delay line.

19. The method of claim 15, further comprising delaying each tap enable of the delay line by approximately the same delay as the first clock propagating through the delay line to a corresponding delay tap.

20. The method of claim 15, further comprising enabling each delay tap of the delay line when it is at a predetermined logic level.

* * * * *